United States Patent [19]

Hornbeck

[11] Patent Number: 4,596,992

[45] Date of Patent: Jun. 24, 1986

[54] LINEAR SPATIAL LIGHT MODULATOR AND PRINTER

[75] Inventor: Larry J. Hornbeck, Van Alstyne, Tex.

[73] Assignee: Texas Instruments Incorporated, Dallas, Tex.

[21] Appl. No.: 646,399

[22] Filed: Aug. 31, 1984

[51] Int. Cl.$^4$ ............................................. G02B 5/14
[52] U.S. Cl. .............................. 346/76 PH; 350/356; 350/360; 346/107 R
[58] Field of Search .................. 346/107 R, 155, 160; 350/360, 356; 358/300

[56] References Cited

U.S. PATENT DOCUMENTS 4,281,904  8/1981  Sprague et al. ...................... 350/356
4,450,458  5/1984  Araghi et al. ..................... 346/160 X Primary Examiner—E. A. Goldberg
Assistant Examiner—A. Evans
Attorney, Agent, or Firm—Carlton H. Hoel; Robert O. Groover; James T. Comfort

[57] ABSTRACT

A linear spatial light modulator with two offset rows of pixels for slight overlap of images, and a printer system using such a spatial light modulator with dark field projection optics is disclosed. The pixels include electrostatically deflectable elements which all bend in the same direction to permit use of dark field projection. The addressing electrodes for the elements are beneath the reflecting surface and arranged perpendicular to the rows of pixels with half on each side of the rows. The printer uses a xerographic engine for conversion of modulated light into print, and an entire row is printed without any scanning.

8 Claims, 31 Drawing Figures

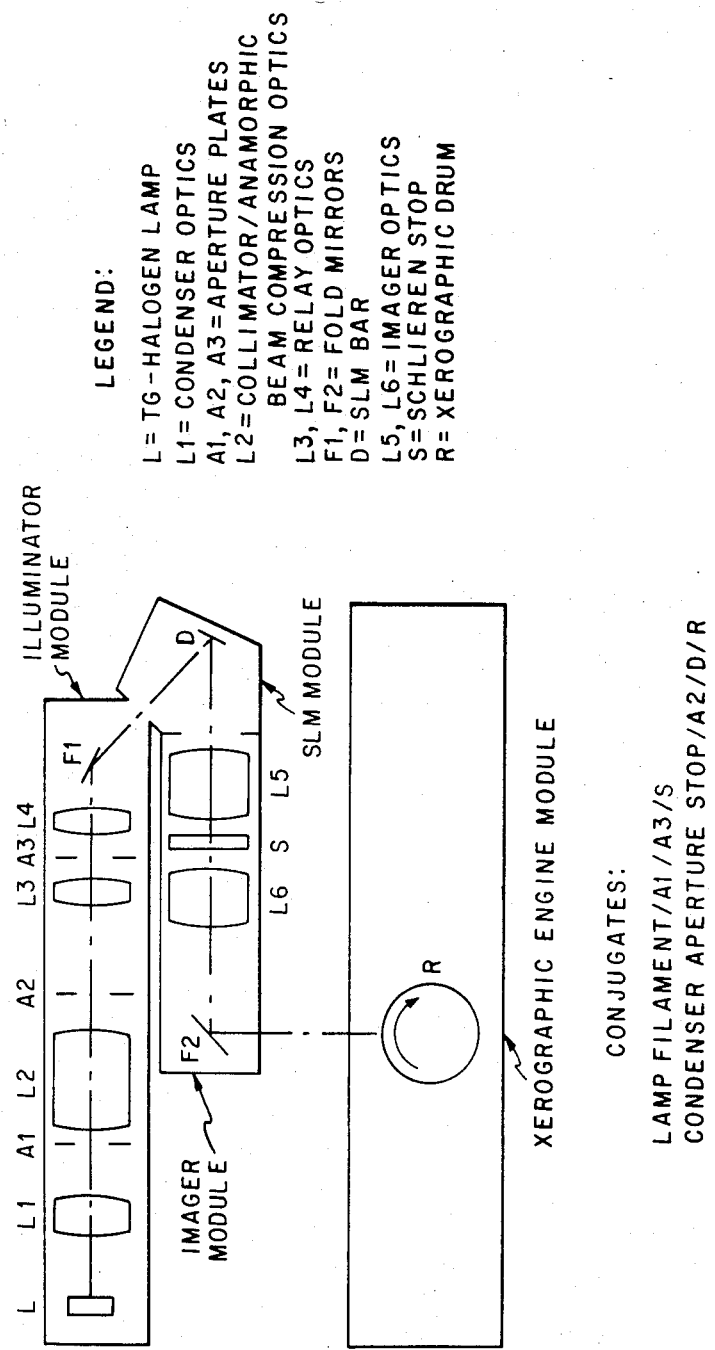

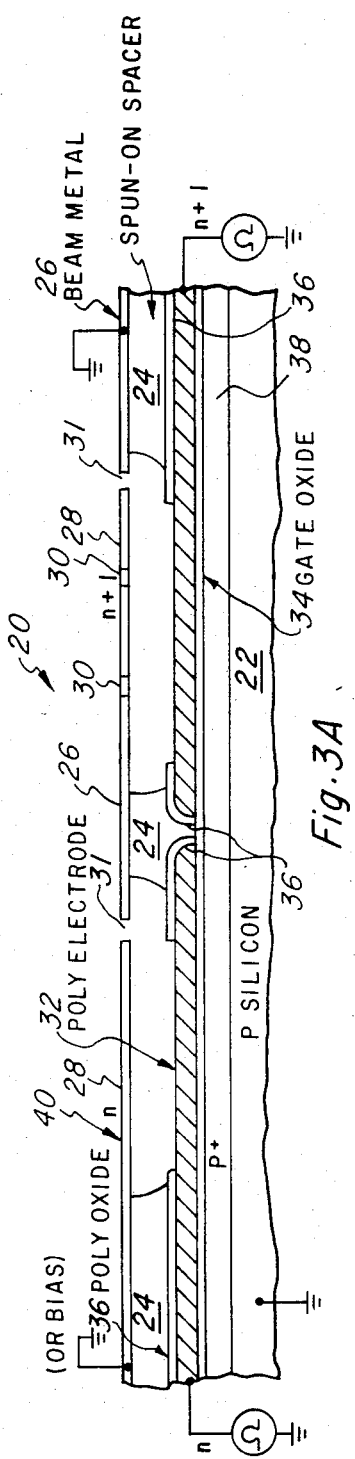
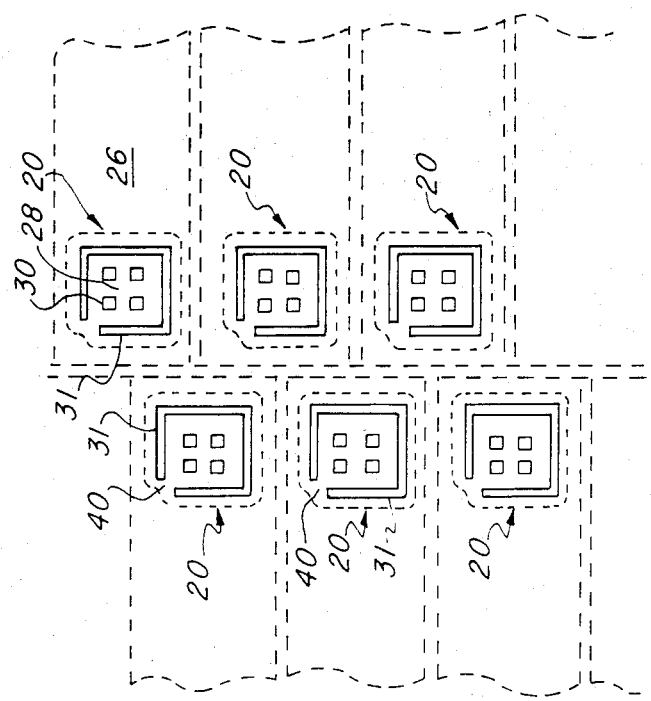
Fig. 3A
Fig. 3B $E = TB \sin^2 A$
INCIDENT CONE ANGLE A
BEAM BEND ANGLE B

X 0.33 PERPENDICULAR
X 6.7 PARALLEL (a) 45° FLAP  (b) 90° FLAP  (c) DIVING BOARDS (d) 45° EXTENDED HINGE  (c) 90° EXTENDED HINGE  (f) TORSION HINGES

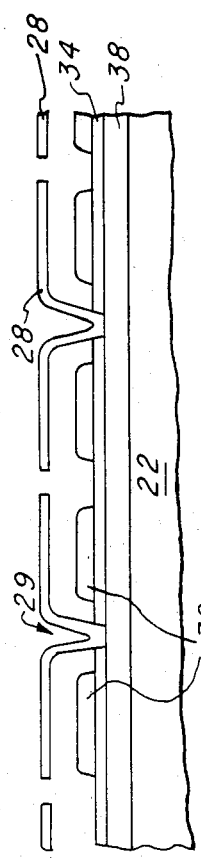
Fig.15C
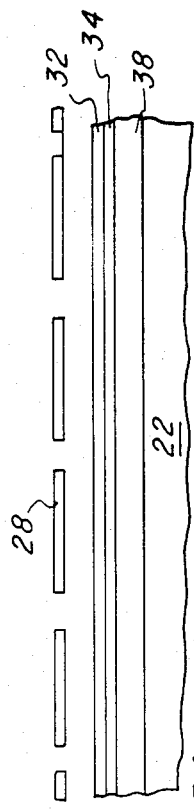
Fig.15A
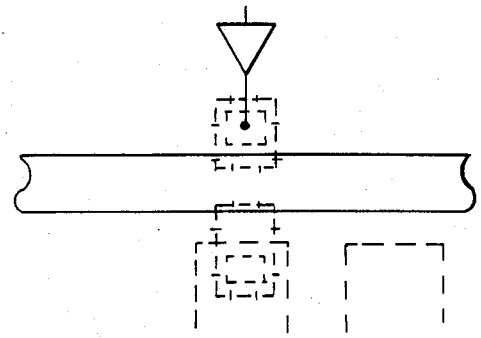
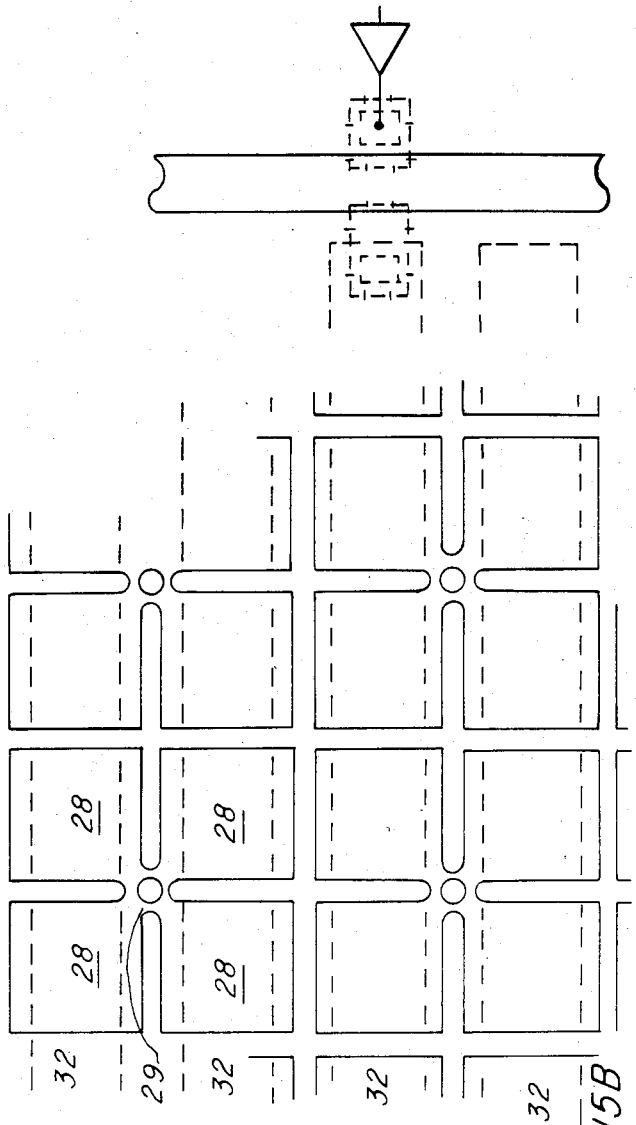
Fig.15B
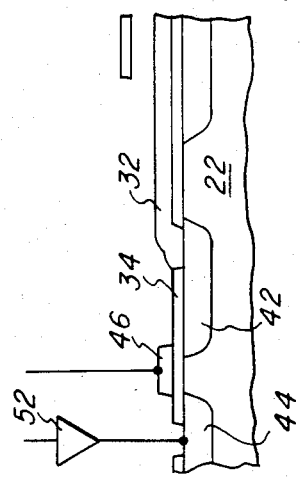

LINEAR SPATIAL LIGHT MODULATOR AND PRINTER

RELATED APPLICATIONS

Applicant's copending and commonly owned applications Ser. Nos. 635,967 (filed July 31, 1984), 636,180 (filed July 31, 1984), 635,066 (filed July 31, 1984), and 659,387 (filed Oct. 10, 1984) also disclose portions of the present disclosure.

BACKGROUND OF THE INVENTION

The present invention relates to spatial light modulators (light valves) and nonimpact printers, and, more particularly, to spatial light modulators with pixels formed of electronically addressable deflectable beams and arranged in a substantially linear array for use in electrophotographic printing.

Spatial light modulators (SLM) are transducers that modulate incident light in a spatial pattern corresponding to an electrical or optical input. The incident light may be modulated in its phase, intensity, polarization, or direction, and the light modulation may achieved by a variety of materials exhibiting various electrooptic or magnetoopotic effects and by materials that modulate light by surface deformation. SLMs have found numerous applications in the areas of optical information processing, projection displays, and electrostatic printing. See references cited in L. Hornbeck, 128×128 Deformable Mirror Device, 30 IEEE Tran. Elec. Dev. 539 (1983).

A well known SLM used for large bright electronic displays is the Eidophor, a system which uses an electrostatically dimpled oil film as the active optical element. See, E. Baumann, The Fischer large-screen projection system (Eidophor), 20 J. SMPTE 351 (1953). In this system a continuous oil film is scanned in raster fashion with an electron beam that is modulated so as to create a spatially periodic distribution of deposited charge within each resolvable pixel area on the oil film. This charge distribution results in the creation of a phase grating within each pixel by virtue of the electrostatic attraction between the oil film surface and the suporting substrate, which is maintained at constant potential. This attractive force causes the surface of the film to deform by an amount proportional to the qnatity of deposited charge. The modulated oil film is illuminated with spatially coherent light from a xenon arc lamp. Light incident to modulated pixels on the oil film is diffracted by the local phase gratings into a discrete set of regularly spaced orders which are made to fall on a schlieren stop consisting of a periodic array of alternating clear and opaque bars by part of the optical system. The spacing of the schlieren stop bars is chosen to match the spacing of the diffracted signal orders at the stop plane so that high optical throughput efficiency is achieved. Light that is incident to unmodulated regions of the light valve is blocked from reaching the projection lens by the opaque bars of the schlieren stop. Images formed of unmodulated areas on the light valve by the schlieren imaging system on the projection screen are therefore dark, while the phase perturbations introduced by the molulated electron beam are converted into bright spots of light at the screen by the schlieren projector. In spite of numerous technical difficulties associated with oil polymerization by electron bombardment and organic vapor contamination of the cathode, this type of oil-film system has been successfully developed to the point that it is the almost universally used system for a total light requirement of thousands of lumens at the screen. However, such systems are expensive, bulky, and have short-lived components.

A number of non-oil-film SLMs have also been developed and include deflectable element types, rotation of plane of polarization types, and light scattering types. these SLM types employ various effects such as deformation of reflective layers of metal, elastomer, or elastomer-photoconductor, and polarization and scattering of ferroelectrics, PLZT ceramics, and liquid crystals. For example, R. Sprague et al, Linear total internal reflection spatial light modulator for laser printing, 299 Proc. SPIE 68 (1981) and W. Turner and R. Sprague, Integrated total internal reflection (TIR) spatial light modulator for laser printing, 299 Proc. SPIE 76 (1982) and U.S. Pat. No. 4,380,373 describe a system for nonimpact printing on a photosensitive medium in which laser light is formed into a line of illumination and passed through a linear array of light modulators and then imaged onto the photosensitive medium. The array is implemented as a total internal reflection spatial light modulator with the electrodes and drive electronics fabricated on an integrated drive element which is placed against the total reflection surface of an electrooptic crystal such as lithium niobate. The localized change in index of refraction produced by the fringing field between each two electrodes is read out with schlieren readout optics which image the TIR interface onto the photosensitive medium. This is a one dimensional image, and the photosensitive medium is rotated on a drum beneath the image of the linear array to generate the two dimesional image (e.g., a page of text) for printing applications. However, the SLM (light valve) is highly susceptible to fabrication problems due to its hybrid nature. The fringing field strength, and hence the amount of light diffracted from modulated pixels, is sensitive to changes in the air gap thickness between the address electrodes and the electrooptic crystal surface of less than one tenth micron. Thus, even very small particles trapped between the crystal and electrode structure could cause illumination nonuniformity problems at the photosensitive medium. The system optical response for pixels located at the boundary between modulated and unmodulated areas of the light valve is also significantly lower than the response for pixels near the middle of a modulated region due to the nature of the addressing technique. A commercially available printer based on this technology has not been introduced to date.

M. Little et al., CCD-Addressed Liquid Crystal Light Valve, Proc. SID Symp. 250 (April 1982) describes a SLM with a CCD area array on the front side of a silicon chip and a liquid crystal array on the backside of the chip. Charge is input into the CCD until a complete frame of analog charge data has been loaded; the charge is then dumped to the backside of the chip where it modulates the liquid crystal. This device suffers from severe fixed pattern noise as well as resolution degradation due to the charge spreading from the front-to-back transfer.

Another SLM type which may be fabricated in both one and two dimensional arrays is the deformable mirror. Deformable mirrors may be subdivided into three classes: elastomers, membranes, and cantilever beams. In the elastomer approach a metallized elastomer is addressed by a spatially varying voltage that produces surface deformation through compression of the elastomer. Because of the address voltage requirements in the order of one or two hundred volts, the elastomer is not a good candidate for integration with a high-density silicon address circuit. See, generally, A. Lakatos and R. Bergen, TV projection display using an amorphous-Se-type RUTICON light valve, 24 IEEE Tran. Elec. Dev. 930 (1977).

Membrane deformable mirrors come in a variety of types. One type is essentially a substitute for the oil film of the Eidophor system discussed above. In this system a thin reflective membrane is mounted to the faceplate of a cathode ray tube (CRT) by means of a support grid structure. Addressing is by a raster scanned electron beam as with the Eidophor. The charge deposited on the glass faceplate of the CRT by the electron beam electrostatically attracts the membrane which is held at a constant volatge. This attractive force causes the memebrane to sag into the well formed by the grid structure, thereby forming a miniature spherical mirror at each modulated pixel location. The light diffracted from this type of modulated pixel is concentrated into a relatively narrow cone that is rotationally symmetric about the specularly reflected beam. This type of light valve is thus used with a schlieren stop that consists of a single central obsucration positioned and sized so as to block the image of the light source that is formed by the optical system after specular reflection from unmodulated areas of the light valve. Modulated pixels give rise to a circular patch of light at the schlieren stop plane that is larger than the central obscuration, but centered on it. The stop efficiency, or fraction of the modulated pixel energy that clears the schlieren stop, is generally somewhat lower for projectors based on deformable membranes than it is for the oil film Eidophor projector. Further, such membrane deformable mirror systems have at least two major problems. High voltages are required for addressing the relatively stiff reflective membrane, and slight misalignments between the eletron beam raster and the pixel support grid structure lead to addressing problems . Such misalignments would cause image blurring and nonuniformity in display brightness.

Another type of membrane deformable mirror is described in L. Hornbeck, 30 IEEE Tran. Elec. Dev. 539 (1983) and U.S. Pat. No. 4,441,791 and is a hybrid integrated circuit consisting of an array of metallized polymer mirrors bonded to a silicon address circuit. The underlying analog address circuit, which is separated by an air gap from the mirror elements, causes the array of mirrors to be displaced in selected pixels by electrostatic attraction. The resultant two-dimensional displacement pattern yields a corresponding phase modulation pattern for reflected light. This pattern may be converted into analog intensity variations by schlieren projection techniques or used as the input transducer for an optical information processor. However, the membrane deformable mirror has manufacturability problems due to the susceptibility to defects that result when even small, micron sized paticles are trapped between the membrane and the underlyiong support structure. The membrane would form a tent over these trapped particles, and the lateral extent of such tents is much larger than the size of the particle itself, and these tents would in turn be imaged as bright spots by a schlieren imaging system.

A cantilever beam deformable mirror is a micromechanical array of deformable cantilever beams which can be electrostatically and individually deformed by some address means to modulate incident light in a linear or areal pattern. Used in conjunction with the proper projection optics, a cantilever beam deformable mirror can be employed for displays, optical information processing, and electrophotographic printing. An early version with metal cantilever beams fabricated on glass by vacuum evaporation appears in U.S. Pat. No. 3,600,798. This device has fabrication problems which include the alignment of the front and back glass substrates arising from the device's nonintegrated architecture.

A cantilever beam deformable mirror device is described in R. Thomas et al, The Mirror-Matrix Tube: A Novel Light Valve for Projection Displays, 22 IEEE Tran. Elec. Dev. 765 (1975) and U.S. Pat. Nos. 3,886,310 and 3,896,338. This device is fabricated as follows: a thermal silicon dioxide layer is grown on a silicon on sapphire substrate; the oxide is patterned in a cloverleaf array of four cantilever beams joined in the middle. The silicon is isotropically wet etched until the oxide is undercut, leaving within each pixel four oxide cantilever beams supported by a central silicon support post. The cloverleaf array is then metallized with aluminum for reflectivity. The aluminum which is deposited on the sapphire substrate forms a reference grid electrode which is held at a DC bias. The device is addressed by a scanning electron beam which deposits a charge pattern on the cloverleaf beams causing the beams to be deformed by electrostatic attraction towards the reference grid. Erasure is achieved by negatively biasing a closely spaced external grid and flooding the device with low-energy electrons. A schlieren projector is used to convert the beam deformation into brightness variations at the projection screen. A significant feature of this device is the cloverleaf geometry which leads to beam deflection in a direction rotated forty-five degrees from the openings between the beams; this permits use of a simple cross shaped schlieren stop to block out the fixed diffraction background signal without attenuating the modulated diffraction signal. The device was fabricated with a pixel density of five hundred pixels per inch with beams deflectable up to four degrees. The optics employed a 150 watt xenon arc lamp, reflective schlieren optics and a 2.5 by 3.5 foot screen with a gain of five. Four hundred TV lines of resolution were demonstrated with a screen brightness of thirty-five foot-lumens, a contrast ratio of fifteen to one, and a beam diffraction efficiency of forty-eight percent. Write times of less than 1/30 second were achieved and erase times were as short as 1/10 of the write time. However, the device has problems, including degradation of resolution from scanning errors, poor manufacturing yield, and no advantage over conventional projection cathode ray tubes. That is, the scan-to-scan positioning accuracy is not high enough to reproducibly write on individual pixels. The resultinig loss of resolution forces at least a four fold increase in the number of pixels required to maintain the same resolution compared to comparably written phosphor. Also, the device yield is limited by the lack of an etch stop for the cloverleaf support post, the wet etching of the beams leading to beam breakage, and the need to evaporate normally tensile aluminum in a state of zero stress on the oxide beams. Further, the device offers no apparent cost or performance advantage over conventional projection CRTs.

Cantilever beam deformable mirrors integrated on silicon with addressing circuitry, thus eliminating the electron beam addressing with its high voltage circuitry and vacuum envelopes of the previously described cantilever device, appear in K. Petersen, Micromechanical light modulator array fabricated on silicon, 31 Appl. Phys. Lett. 521 (1977) and U.S. Pat. No. 4,229,732. The first of these references describes a 16 by 1 array of diving board-shaped cantilever beams fabricated as follows: an epitaxial layer of <100>-oriented silicon (either p or n) or thickness of about 12 microns is grown on a p substrate (or buried layer); the epilayer is oxidized to a thickness of about 0.5 micron and covered with a Cr-Au film of thickness about 500 A. The Cr-Au is etched away to form contact pads and address lines and to define the diving board metallization. The oxide is etched away in a comb pattern around the metallization in a second masking step. Finally, the silicon itself is etched in a solution of ethylenediamine and pyrocatechol at 120 degrees C. If the proper orientation of the mask with respect to the crystalline axes is maintained, the metal-coated oxide dividing boards will be undercut by the etch and freed from the silicon. Since the etch is anisotropic, further lateral etching will be stopped by the <111> planes defining the rectangular envelope of the comb pattern. In addition, the etchant is inhibited by p+ material, so the depth of the well beneath the diving boards is defined by the thickness of the epilayer. When a dc voltage is applied between the substrate and the diving board metallization, the thin oxide diving board will be electrostatically deflected downward into the etched well. Diving boards of length 106 microns and width 25 microns showed a threshold voltage of about 66 volts.

The second reference (U.S. Pat. No. 4,229,732) describes devices fabricated in a manner similar to the diving board device (a buried p+ layer as an etch stop for forming the wells underneath metallized silicon dioxide cantilever beams) but has a different architecture; namely, the cantilever beams are in the shape of square flaps hinged at one corner, the flaps form a two dimensional array instead of the one dimensional row of diving boards, and the wells underneath the flaps are not connected so that addressing lines for the flaps may be formed on the top surface of the silicon between the rows and columns of flaps. Of course, the corner hinging of the flaps derives from the cloverleaf architecture of U.S. Pat. Nos. 3,886,310 and 3,896,338, but the full cloverleaf architecture could not be used because this would preclude the surface addressing lines since cloverleaf flaps are hinged to a central post isolated from the silicon surface. Further, these devices have problems including poor resolution and low efficiency due to density limitations and the small fractional active area, low manufacturing yield, degradation of contrast ratio due to diffraction effects from the address circuitry, and residual image due to the charging effects of the oxide flap. More particularly, the addressing circuitry is squeezed around the active area (flaps) because no option exists for placing the address circuitry under the active area due to the wells being formed by etching away the epilayer down to the p+ etch stop. Thus the active area is reduced substantially together with the diffraction efficiency. This means more lamp power is required for the same screen brightness. Because the address circuitry requires additional area, the pixel size is increased far beyond the flap area with a resulting decrease in achievable resolution. The wet etching required to form the wells leads to low electrical and mechanical yield; indeed, wet cleanups, such as after dicing into chips, destroy flaps and diving boards because during the spin-rinse/dry cycle the water trapped under the beam breaks the beam as it is spun from the surface. If the water is instead evaporated from the surface it leaves behind surface residues which can increase surface leakage currents contributing to erratic device operation. Also, the addressing circuitry being on the silicon surface is exposed to the incident light to be modulated and creates unwanted diffraction effects from the transistor gates plus lowers the contrast ratio. In addition, light leakage into the address structure produces photogenerated charge and reduces storage time. Lastly, the oxide/metal flap has the insulating side facing the well and will charge up due to the intense electric fields which exist across the well; this produces a residual ("burn-in") image. The AC drive required to eliminate this residual image problem cannot be supplied by the NMOS drive circuitry described. Further, if the flap is deflected past the maximum stable deflection, then it will collapse and stick to the bottom of the well. Thus, voltages over the collapse voltage must be absolutely avoided.

A variation of the cantilever beam approach appears in K. Petersen, Silicon Torsional Scanning Mirror, 24 IBM J. Res. Devp. 631 (1980) and M. Cadman et al, New Micromechanical Display Using Thin Metallic Films, 4 IEEE Elec. Dev. Lett. 3 (1983). This approach forms metallic flaps which are connected to the surrounding reflective surface at two opposed corners and operate by twisting the flaps along the axes formed by the connections. The flaps are not formed monolithically with the underlying addressing substrate, but are glued to it in a manner analogous to the deformable membrane devices mentioned above.

The cantilever beam references discussed above all suggest that schlieren projection optical systems be used with the cantilever beam devices. But such systems have limitations in terms of attainable optical performance. First, the aperture diameter of the imaging lens must be larger than is necessary to pass the signal energy along. Hence the speed of the lens must be relatively high (or, equivalently, its f-number must be relatively low) to pass all the signal energy around the central schlieren stop obscuration. In addition, the signal passes through the outer portion of the lens pupil in this imaging configuration. Rays of light emanating from any given point on the SLM and passing through the outermost areas of an imager lens pupil are the most difficult ones to bring to a well-corrected focus during the optical design of any imaging lens. When the outer rays are brought under good control, the rays passing through the center of the imager lens are automatically well-corrected. Hence, a greater level of optical design complexity is required of the imaging lens. Second, the field angle over which the imaging lens can form well-corrected images of off-axis pixels on a cantilever beam SLM is also restricted. Any lens design task involves a compromise between the speed of the lens and the field angle it can cover with good image quality. Fast lenses tend to work over small fields, while wide angle lenses tend to be relatively slow. Since the schlieren imager must be well-corrected over its entire aperture, and since this aperture is larger in diameter than is required to pass the image forming light, the field angle that can be covered by the lens is smaller than it could be if a different imaging configuration could be devised in which the signal was passed through the center of an unobscured, smaller diameter lens. Lastly, for an imager lens having a given finite speed, the use of the schlieren stop configuration also limits the size of the light source that can be utilized. This in turn limits the irradiance level that can be delivered to a projection screen or a photoreceptor at the image of a deflected pixel. This irradiance level, or the delivered power per unit area, depends on the product of the radiance of the light source, the transmittance of the optical system, and the solid angle of the cone of image forming rays of light. The source radiance is determined only by the particular lamp that is used. The optics transmittance depends on the stop efficiency for the particular SLM/schlieren stop configuration and surface transmission losses. But the solid angle of the image forming cone of light is directly proportional to the area of the imager lens pupil that is filled with signal energy. The use of a schlieren stop that obscures the central area of the imager lens pupil limits the usable pupil area and thus the image plane irradiance level that can be obtained for a lens of a given speed and a source of a given radiance; this is in addition to the fundamental irradiance limitation that the maximum usable cone of light has an opening angle equal to the beam deflection angle.

Thus the known cantilever beam SLMs have problems including addressing circuitry limiting the fractional active area of the pixels, processing steps giving low yields, sensitivity to film stress in the beams, beam insulator charging effects, lack of overvoltage protection against beam collapse, performance not compatible with low cost optics design, and low contrast ratio due to non planarized addressing circuitry on the surface.

Further, the known nonimpact printer systems have problems including use of SLMs with inherently low manufacturing yield and with complicated optics.

SUMMARY OF THE INVENTION

The present invention provides monolithic spatial light modulators with essentially linear arrays of pixels, each pixel including one or more deflectable beams which can be electronically addressed, and electrophotographic printer systems incorporating such linear spatial light modulators. Preferred embodiments include both pixels with the deflectable beams formed over wells in a spacer layer and pixels with the deflectable beams supported by integral posts without a spacer layer; further, each pixel may have a single beam or a stack of beams.

Preferred embodiment printer systems incorporate monolithic spatial light modulators with on-chip shift registers for addressing the pixels and a offset line of pixels separated into even and odd numbered pixels for both sides of the line addressing with a compensating delay for the offset.

These spatial light modualtors and printer systems solve the problems of the known systems, including low manufacturing yields and complicated optics.

BRIEF DESCRIPTION OF THE DRAWINGS

FIGS. 1A-B are a schematic cross sectional views of preferred embodiment non impact printers incorporating a preferred embodiment linear spatial light modulator;

FIGS. 3A-B are schematic cross sectional and plan views of the optically active areas of the embodiment of FIG. 2;

FIGS. 15A-C are cross sectional and plan views for a third preferred embodiment linear spatial light modulator.

DESCRIPTION OF THE PREFERRED EMBODIMENTS

Preferred embodiments of the inventive deflectable beam spatial light modulators (SLMs) typically include linear or essentially linear arrays of pixels, each pixel individually addressable and containing one or more electrostatically deflectable reflecting beams; the pixels are combined in the form of monolithic silicon based chips. The chips are fabricated by processing silicon wafers, dicing the wafers into chips, followed by processing of the individual chips. The chips will vary in size depending upon the application; for example, a 2400 by 1 linear array of pixels (which could be a component of a 300 dots per inch printer) may be fabricated on a chip about 1300 mils by 250 mils with pixels about 12 microns square. The SLMs operate by reflecting light off of the pixels, the reflected light is modulated by varying the deflection of the beams with electrical signals.

Figure 1B:
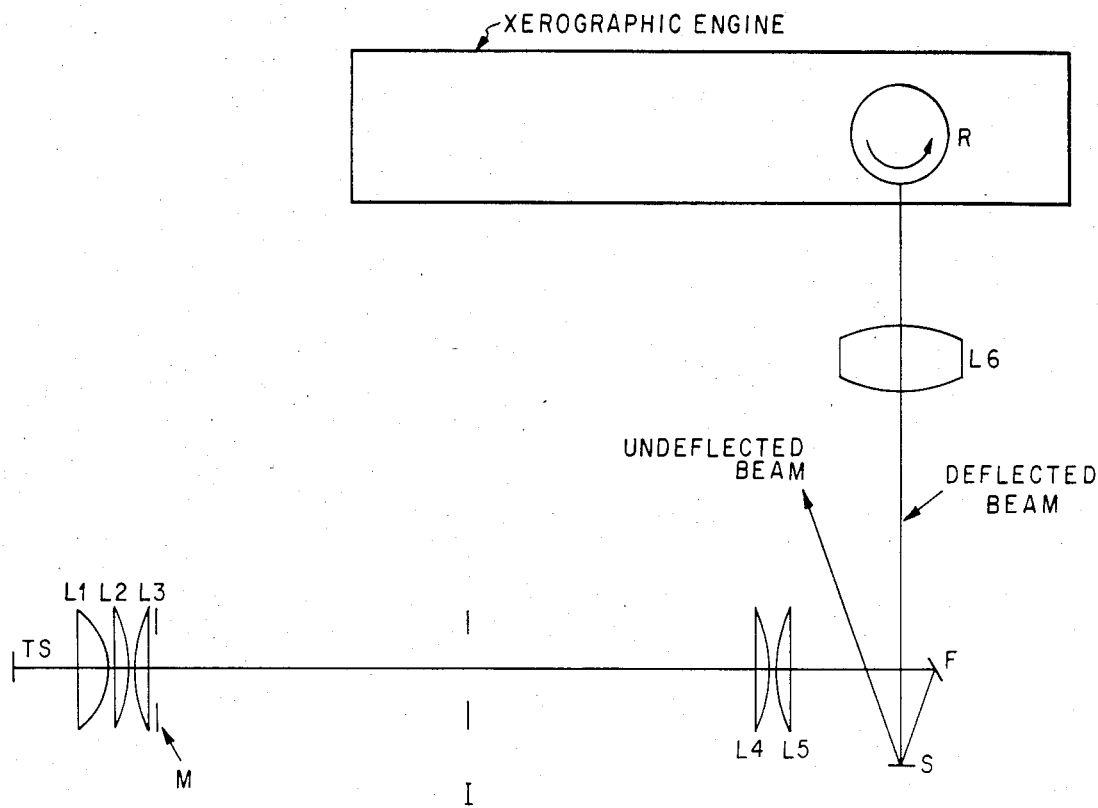

The SLMs typically include on-chip address circuitry and, for the printer example, while a line of dots is being imaged by deflecting beams, the data for the next line is being loaded into the SLM. FIGS. 1A-B schematically illustrate preferred embodiment printer systems which would operate as follows: light from source L or TS is directed along the path shown and collimated into a line perpendicular to both the path and the plane of the drawing; this line of light is reflected off of the pixels of linear SLM S and focussed onto rotating xerographic drum R, the portion of the line of light reflected off of undeflected pixel beams is blocked by schlieren stop S or diverted from lens L6, whereas the portion reflected off of deflected pixel beams deviates around schlieren stop S or deflects into lens L6 to be focussed on drum R. The image on drum R is an image of the line of deflected pixel beams (the image of a each pixel beam being essentially a dot) and oriented parallel to the axis of drum R and on drum R where the path intersects drum R. Over time successive linear patterns of pixel beam deflections are thus transferred into successive linear dot patterns on rotating drum R which transfers the resultant two dimensional image composed of these linear patterns to a piece of paper by the usual xerographic process. Note that FIG. 1 and all of the other drawings are schematic for clarity of explanation.

Figure 2A:
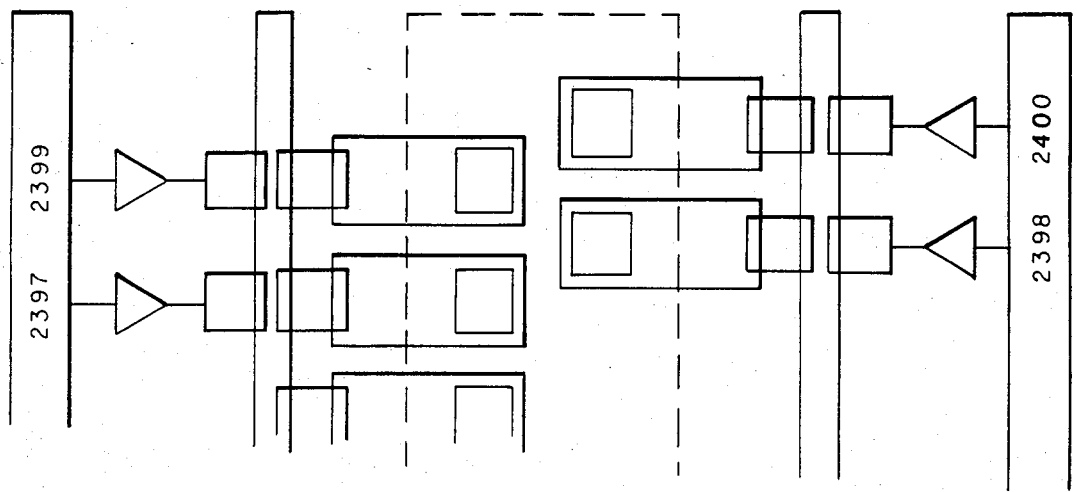
FIGS. 2A-B are schematic plan and equivalent circuit views of a first preferred embodiment linear spatial light modulator.
Figure 2A:
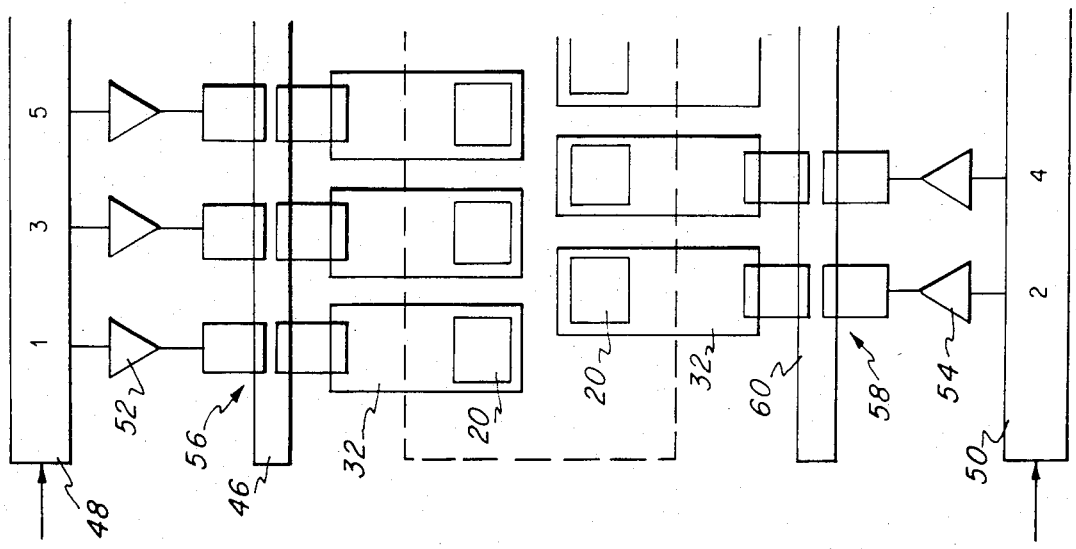
Figure 2B:
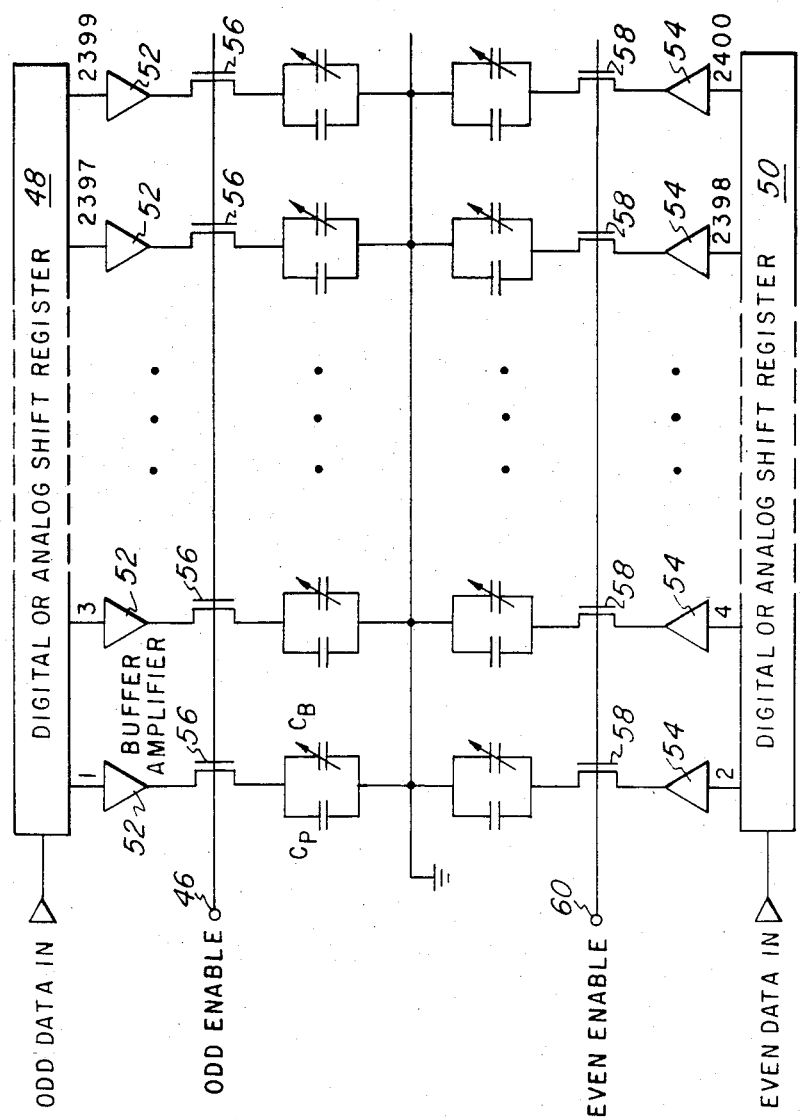

A first preferred embodiment linear spatial light modulator with 2,400 pixels is shown in schematic plan and equivalent circuit views in FIGS. 2A-B; the pixels are represented as variable capacitors because deflection of the beams varies the capacitance of the air gap capacitor formed by the beam and the underlying electrode. The illuminated area is indicated by the dotted lines in FIG. 2A and detail is shown in cross sectional elevation view in FIG. 3A, and in plan view in FIG. 3B. Each pixel, generally denoted 20 and basically a flap covering a shallow well, includes substrate 22, spacer 24, reflecting layer 26, flap 28 formed in layer 26 and containing plasma etch access holes 30, electrode 32, gate oxide layer 34 insulating electrode 32 from substrate 22, and insulating layer 36. Substrate 22 includes a heavily doped upper region 38. Note that in FIG. 3B the dashed lines show the perimeters of electrodes 32 and the dotted lines show the perimeters of spacer 24. Typical dimensions for pixel 20 would be as follows: flap 28 is a square with sides 12 to 25 microns long; spacer 24 is 1 to 2.5 microns thick (so the distance from the bottom surface of flap 28 down to substrate 22 is 1 to 2.5 microns); layer 26 is 0.12 micron (1,200 A) thick; holes 30 are 2 microns square or circular; plasma etch access gap 31 is 2 microns wide; electrode layer 32 is 0.30 micron (3,000 A) thick; gate oxide layer 34 is 0.15 micron (1,500 A) thick; insulating layer 36 is 0.15 micron (1,500 A) thick; and doped region 38 is 1 micron thick. The alignment of pixels 20 to form a linear array for use in a printer as illustrated in FIG. 1 will be discussed below.

Substrate 22 is <100> oriented silicon with resistivity 5 to 10 ohms-cm. Spacer 24 is positive photoresist (novalac resin based) which is an insulator; and layer 26 is aluminum alloyed with 4 percent copper. This alloy has a coefficient of thermal expansion not drastically different from that of spacer 24, and this minimizes the stress between the layers 24 and 26 created by the method of deposition of layer 24 on layer 26, as described below. Electrode layer 32 is polysilicon doped n+; gate oxide layer 34 and insulating layer 36 are silicon dioxide; and doped region 38 is p+.

Figure 4:
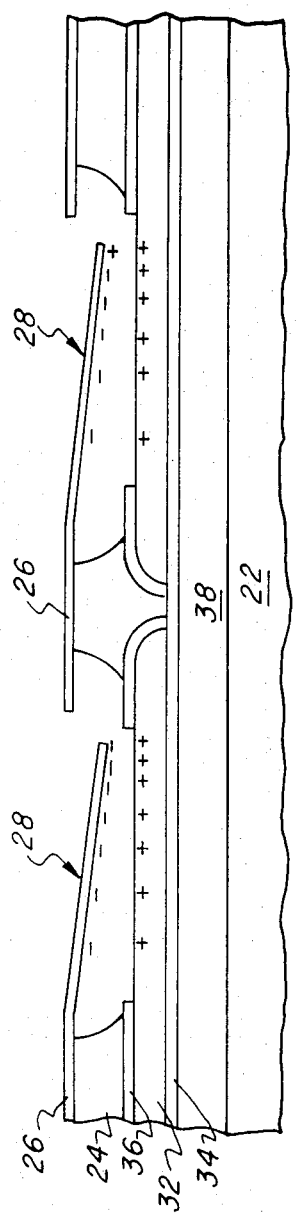
FIG. 4 illustrates electrostatic deflection of beams of the embodiment of FIG. 2.
Figure 5:
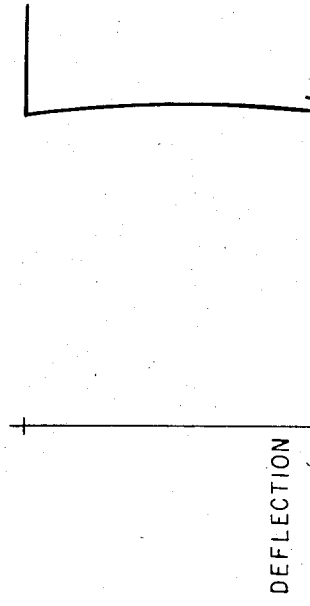
FIG. 5 shows the deflection as a function of voltage.

Pixel 20 is operated by applying a voltage between layer 26 and electrode 32; flap 28 and the exposed surface of electrode 32 form the two plates of an air gap capacitor and the opposite charges induced on the two plates by the voltage exert an electrostatic force attracting flap 28 to electrode 32. This attractive force causes flap 28 to bend at hinge area 40 and be deflected towards electrode 32; FIG. 4 shows an exaggerated view of this deflection together with an indication of the charges concentrated at the regions of smallest gap. For voltages in the range of 20 to 25 volts, the deflection is in the range of 1 to 2 degrees (approximately 0.5 micron vertical movement by the corner of flap 28 farthest from hinge 40 for a 20 micron flap size with 1 degree of deflection). Note that the deflection is a highly nonlinear function of the voltage because the restoring force generated by the bending of hinge 34 is approximately a linear function of the deflection but the electrostatic force varies approximately as the logarithm of the reciprocal of the distance between the closest corner of flap 28 and electrode 32. FIG. 5 illustrates the dependence of deflection on voltage; the voltage at which flap 28 becomes unstable and bends all the way to touch electrode 32 is called the collapse voltage. For voltages somewhat less than the collapse voltage the deflection is roughly a linear function of the voltage (see dotted line in FIG. 5) and this is the analog operating region.

Figure 6A:
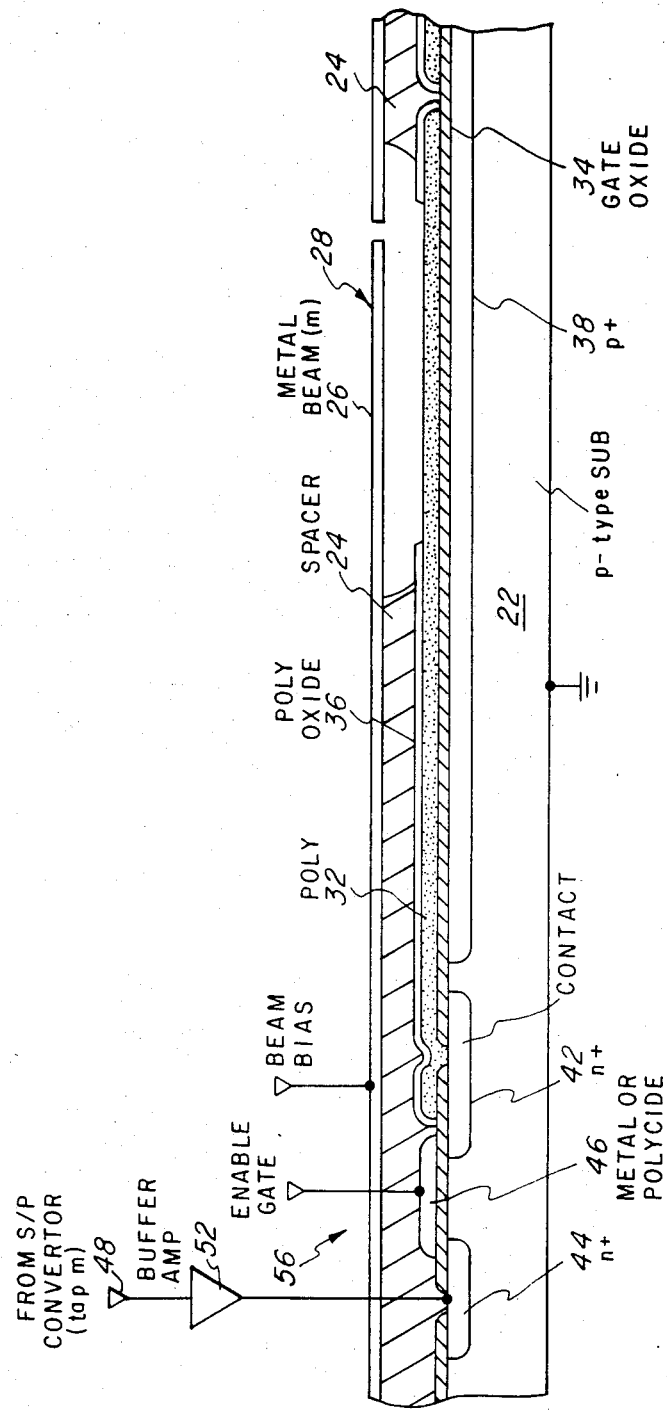
FIGS. 6A-B show the addressing circuitry of the embodiment of FIG. 2.
Figure 6B:
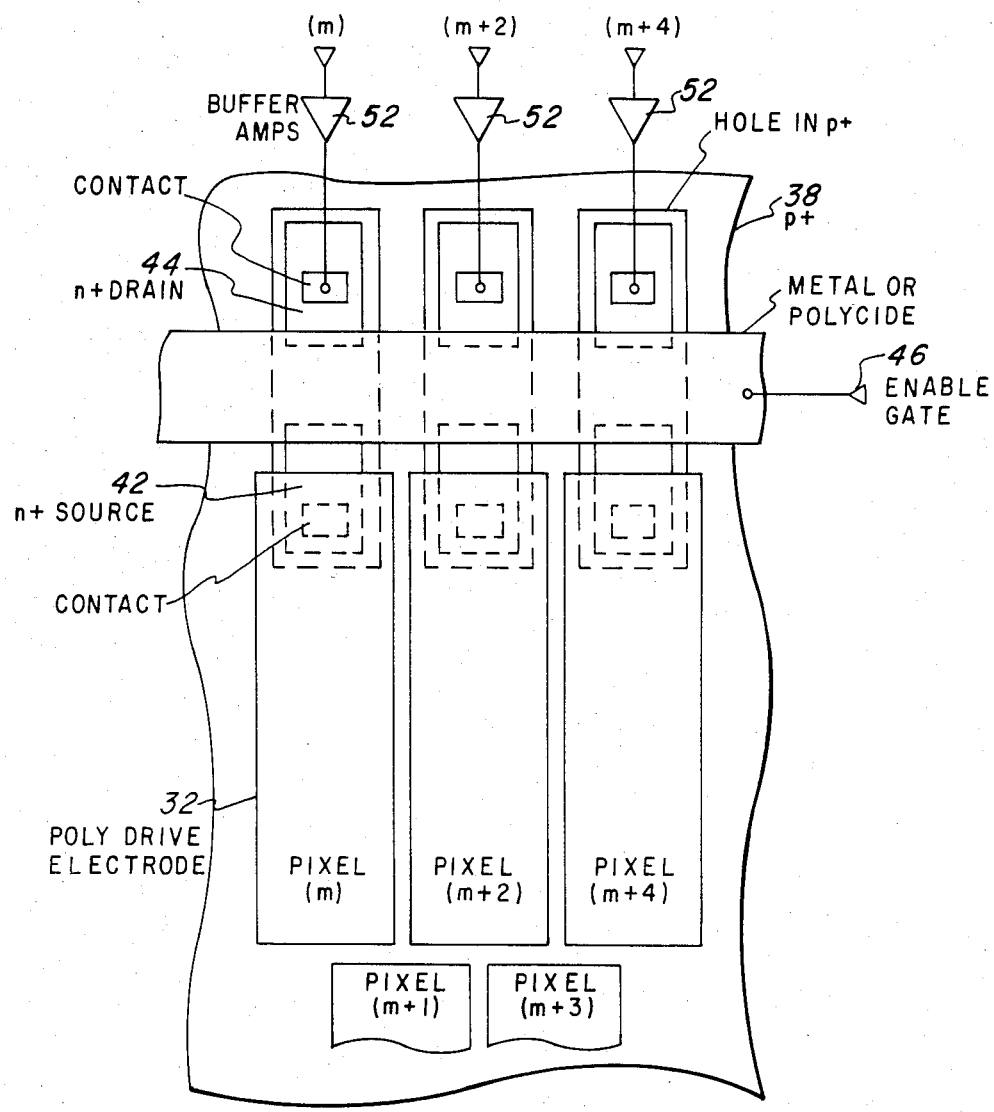

FIGS. 6A-B show cross sectional and plan views, respectively, of the enable field effect transistors for electrodes 32. Each enable FET includes n+ source 42, n+ drain 44, and gate 46 common to all of the FETs on one half of the SLM; see FIG. 2 Note that each enable FET is formed in a hole in p+ layer 38 which serves as channel stops and that FIG. 6B is a view with insulating layer 36, spacer 24, and metal layer 26 removed for clarity.

Figure 7A:
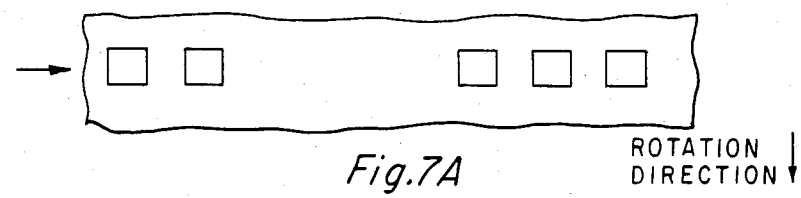
FIGS. 7A-D illustrate sequential images on the xerographic drum of first preferred embodiment printer and the brightness along the rotating drum.
Figure 7B:
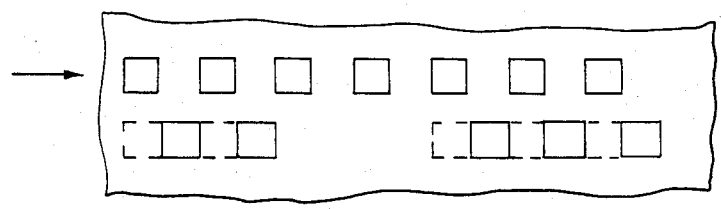
Figure 7C:
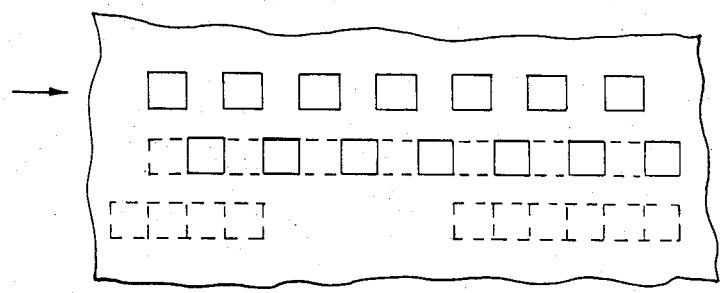
Figure 7D:
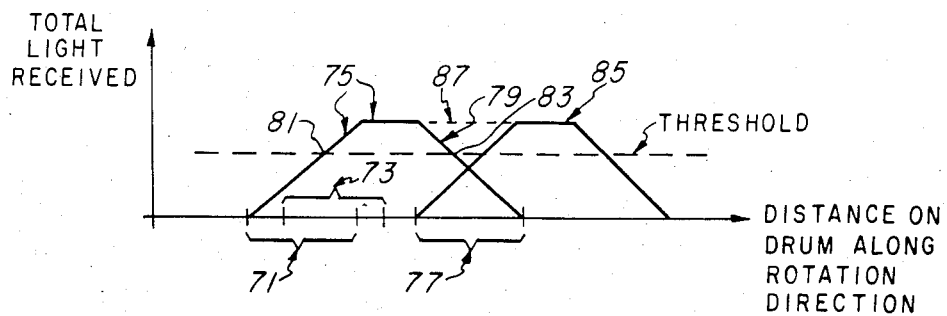

The operation of the first preferred embodiment SLM in the first preferred embodiment printer system illustrated in FIG. 1 can now be elucidated: (1) an image to be printed is discretized into lines of dots (for example, an 8 inch by 10 inch image may be broken into 3,000 lines of 2,400 dots each which is 300 dots per inch in both directions ) and each dot intensity is represented by a signal voltage; (2) the first line of 2,400 dots is subdivided into even and odd numbered dots and the signal voltages corresponding to the odd numbered dots are fed into serial/parallel converter 48 (which has 1,200 taps) and the signal voltages for the even numbered dots are delayed to compensate for the pixel offset (explained below) and then fed into serial/parallel converter 50; serial/parallel converters 48 and 50 output to 1,200 buffer amplifiers 52 and 1,200 buffer amplifiers 54, respectively, which are connected to pixel electrodes 32 by 1,200 enable FETs 56 and 1,200 enable FETs 58, respectively; (3) common gate 46 for enable FETs 56 is pulsed to temporarily turn on the FETs and thereby set pixel electrodes 32 to the signal voltages corresponding to the odd numbered dots and cause corresponding deflections of the beams 28 of the pixels in the upper row of pixels in FIGS. 2A and 6B ( the left column of pixels in FIG. 3B); (4) once gate 46 has turned off the FETs, the loading of the second line of odd numbered dot voltages begins, but the beams 28 maintain their first line of dots deflections and images on the rotating drum during the loading (see FIG. 7A which illustrates the instantaneous images of a row of seven beams with the third and fourth beams from the left undeflected); (5) once the drum has rotated enough to compensate for the distance between the upper and lower rows of pixels, then common gate 60 is pulsed to temporarily turn on FETs 58 and thereby set pixel electrodes 32 to the signal voltages corresponding to the even numbered dots and cause corresponding deflections of beams 28 of the pixels in the lower row of pixels in FIGS. 2A and 6B (the right column of pixels in FIG. 3B); (6) once gate 60 has turned off the FETs, the loading of the second line of even numbered dot voltages begins, and the beams maintain their first line of dots deflections and images on the rotating drum during the loading; meanwhile gate 46 has again been pulsed and the second line of odd numbered images is on the rotating drum (see FIG. 7B which shows the second line of odd numbered images with all seven beams deflected as the upper row of solid line squares together with the first line of even numbered images with the third and fourth beams of seven undeflected; also the regions on the drum shown in FIG. 7A have now moved to the locations shown in dotted lines); and (7) the process is repeated with the third line of odd numbered images and the second line of even numbered images; FIG. 7C shows the instantaneous images plus the locations of the images illustrated in FIGS. 7A-B. In contrast to the instantaneous images of FIGS. 7A-C, FIG. 7D illustrates the combination of drum rotation and finite hold time of the beam deflections which make the total light received a ramp up/ramp down function of distance along the drum in the direction of rotation. In greater detail and with reference to FIG. 7D for an example, if a beam is switched from the undeflected to deflected state at time 0, then an image of the beam will be created on the drum at the location 71. Now the drum is rotating, so the image moves on the drum, and at time t the image is at location 73. Thus the left hand portion of location 71 is no longer receiving light, but that portion of location 71 overlapping location 73 is still receiving light. As the drum continues rotating, this overlap diminishes and the total light received is the ramp up function 75. If the beam is now switched to the undeflected state just as the image reaches location 77, then the total light so far received along location 77 is function 79 which ramps down because the right hand portion of location 77 has not been illuminated as long as the left hand portion due to the motion of the image. Thus the total light received as a function of distance on the drum due to a single beam only being deflected for a time interval corresponding to the drum moving the distance from one line to the next is given by the function with graph 75-79. The size of the dot printed due to this received light can be adjusted by varying the threshold in the xerographic process; for example, with the threshold set as indicated by the dashed line, the printed dot size in the direction from one line to the next is given by 81-83. Lastly, if the same beam is also deflected for the next line, then light corresponding to graph 85 is received, and the two graphs add to give the total light received, as indicated by dotted line 87. Of course, graphs 75-79 and 85 would be triangular (without the flat spot on top) of the distance between lines is just the length of the image, and in this case locations 71 and 77 would be adjacent and FIGS. 7A-C would illustrate a delay corresponding to the drum moving twice the distance from one line to the next (i.e., the third line of odd numbered images would be illuminating the drum simultaneously with the first line of even numbered images in FIG. 7B) and the blank rows suggested by the figures would be filled.

The steps for fabrication of the optical active area of first preferred embodiment SLM (that is, the portion shown in FIG. 6A) are illustrated in FIG. 8 and as follows. (1) Start with a <100> oriented silicon substrate of resistivity 5 to 10 ohms-cm (typically the substrate will be in the form of a three inch diameter circular wafer); (2) implant p+ region 38 and n+ regions 42 and 44 with standard techniques; (3) grow gate oxide 34 and open holes for contacts to regions 42 and 44; (3) LPCVD deposit and pattern polysilicon electrodes 32 and dope by POCl$_3$ deposition; (4) grow oxide 36 on polysilicon 32 and open up holes in it at the locations for the cantilever beams; (5) deposit and pattern metal to form gate 46; (6) spin on a layer of positive photoresist which is insoluble in chlorobenzene (for example, novalac resin based resists), if the layer is to be about 2 microns thick, then this spin-on should be done in three stages to avoid surface waves which develop in thick spun on layers, that is, spin on about 0.7 micron of resist, bake, spin on another 0.7 micron of resist, bake again, spin on a last 0.7 micron of resist and bake a final time; (7) sputter deposit a 0.12 micron layer of aluminum alloyed with 4 percent copper at close to room temperature to minimize thermal mismatch and the resulting stress between the metal and resist layers; (8) apply a positive photoresist and photolithographically pattern it to define the plasma etch access holes and gap (see FIG. 8C); (9) plasma etch the exposed aluminum alloy (for example, chlorine-boron trichloride-silicon tetrachloride etch gas can be used) to form the plasma etch access holes and gaps; (10) spin on a layer of PMMA (polymethyl methacrylate) to act as a protective layer during subsequent steps; (11) dice the substrate into chips (each chip will become an SLM) (see FIG. 8D where the dicing debris is indicated schematically); (12) dissolve the PMMA by spraying with chlorobenzene and immediately centrifuge to remove the dicing debris, note that the positive resist does not dissolve in the PMMA solvent; (13) plasma etch the chips to remove the spacer (positive photoresist) from under the flaps and thereby form the wells under the flaps, this etch also removes the resist layer on the top of the flaps and completes the chip processing (see FIGS. 8E-F). Note that the flap is not exposed directly to dicing debris, either during the dicing operation or during protective PMMA cleanup. A convenient plasma etch in step 13 is based on oxygen; oxygen rapidly etches PMMA and photoresist but neither silicon nor aluminum. This plasma etch must be at low temperature because the spacer will soften at about 120 degrees C.

Figure 8A:
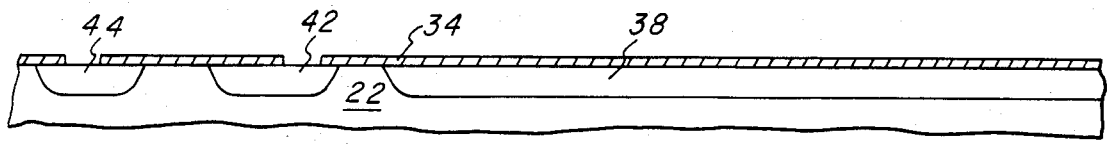
FIGS. 8A-F illustrate the steps in fabricating the embodiment of FIG. 2.
Figure 8B:
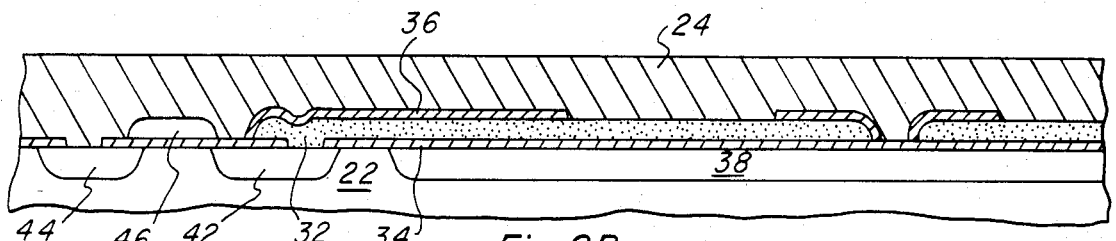
Figure 8C:
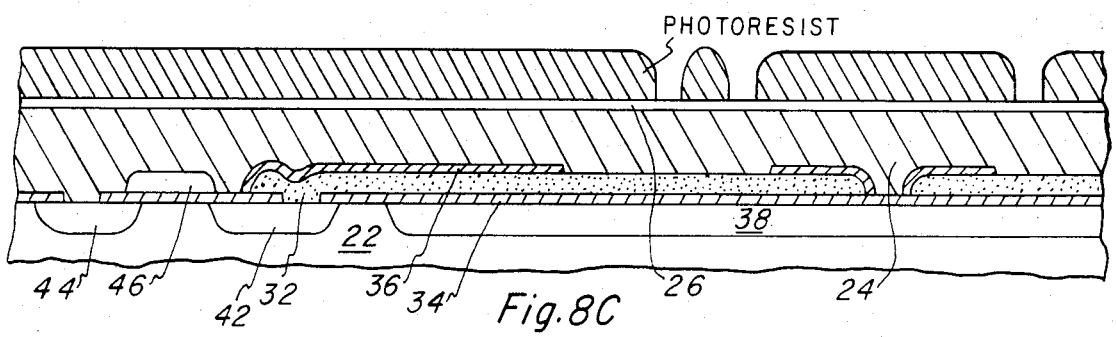
Figure 8D:
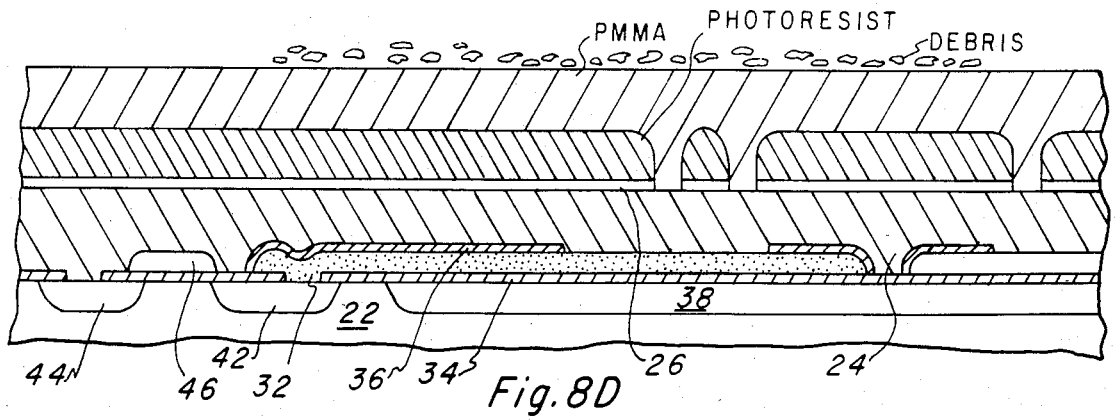
Figure 8E:
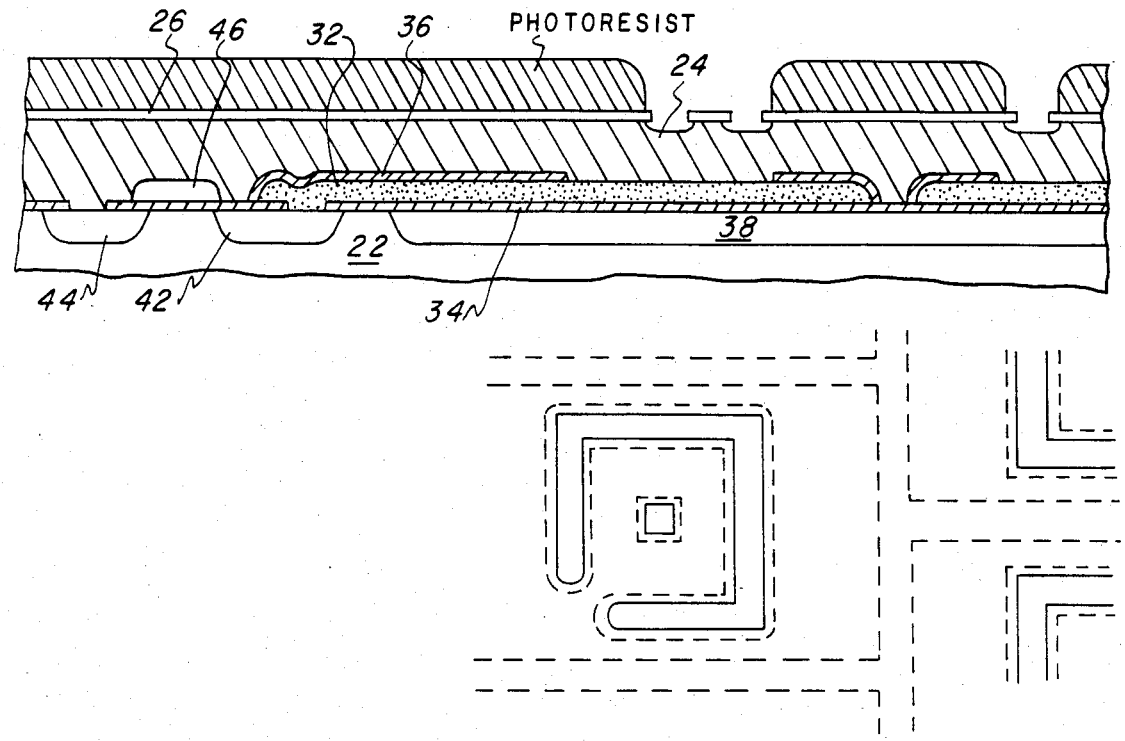
Figure 8F:
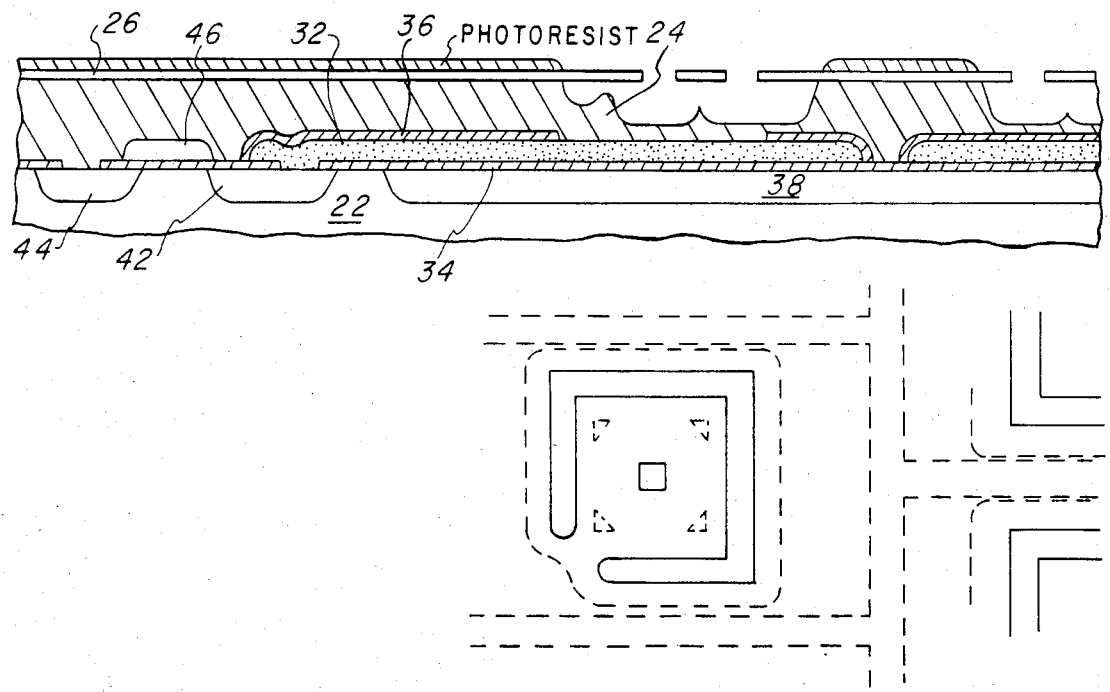

Of course, the plasma etch in step 13 must be monitored or timed because the continued removal of spacer beyond that between the flap and the substrate will eventually remove the support for reflective layer 26 and encroach on neighboring pixels. And this is the reason for plasma etch access holes in the flap. As illustrated in FIGS. 8E-F, the removal of spacer is not orientation dependent and undercuts layer 26 at the same speed that it undercuts flap 28. FIG. 8E shows the early stages of the etch: the lower portion is a plan view with the horizontal extent of the undercut indicated by dotted lines, and the upper portion is a cross sectional elevation llustrating the effect of the plasma etch access holes 30. FIG. 8F shows a successive stage, and FIGS. 3A-B the completed etch. Holes 30 are most effective for shallow wells, that is, spacer 24 thin, as is apparent from FIG. 8F, although only one hole is illustrated. Four, nine, or more holes per flap are useful for various flap size and well depth combinations.

One aspect of spacer 24 is its planarizing effect: electrodes 32, insulating layer 36, and enable FETs 56 and 58 present a nonplanar surface, but reflecting layer 26 of beam metal is planar in the optically active area and avoids fixed pattern noise.

The holes in insulating layer 36 at the bottom of the wells under flaps 28 (see FIG. 4) avoids the problem of charge build up on the insulator due to the large electric fields in the well (typically, 20-25 volts are used to deflect flaps 28, and if the flaps deflect to within one micron of the well bottom, then the electric fields approach 250,000 volts per cm). These holes in insulating layer 36 implies that only conducting surfaces are involved. These holes are provides overvoltage protection. Recall (see FIG. 5 and related discussion) that exceeding the collapse voltage leads to flap 28 collapsing to underlying electrode 32; if the electrode were insulated, then the force of attraction of the flap to the electrode is very large and the flap is flattened against the electrode where it permanently sticks. However, if the electrode is uninsulated at the point of contact of the flap with the electrode and the enable FET is turned off, then the electrode will be quickly discharged to ground, thus removing the attractive force. In order to quarantee that the enable FET is turned off before the flap can touch the electrode, it is necessary to have the FET gate pulsed for a shorter time period than the mechanical response time of the flap. If the mechanical repsonse time is on the order of one microsecond, then it is necessary to use a metal or silicide gate material to reduce propagation delays and to use a FET with suitably large transconductance.

P+ layer 38 (see FIGS. 6A–B) prevents turn-on of the silicon by electrodes 32 and limits the lifetime of photogenerated minority carriers. These carriers are produced by light leakage through the flap perimeter gaps and plasma etch access holes, and they must be prevented from diffusing from the flap sites to the enable FETs.

Buffer amplifiers 52 and 54 convert the output (digital or analog) of converters 48 and 50 into the appropriate voltage level necessary to deflect flaps 28, typically 20 volts. Each buffer amplifier drives polysilicon electrode 32 whose capacitance to substrate 22 and reflecting layer 26, denoted Cp, is in parallel with the variable capacitance to flap 28, denoted Cb. Enabling FET 56 or 58 strobes the buffer amplifier output onto the polysilicon electrode 32 after converter 48 or 50 has been loaded with a complete line of odd or even dot data. Spacer 24 and reflecting layer (beam metal) 26 cover all of the optically active area and form a planarized light shield which protects the addressing circuitry from photogenerated leakage currents and reduces unwanted light diffraction from the contours of the address structure. The only direct light leakage is through the gaps that define the flap perimeter and the plasma etch access holes. The p+ layer 38 underlying the gaps limits the migration by diffusion of photogenerated minority carriers into the addressing circuitry. An opening in p+ layer 38 is defined at the location of each enable FET 56 and 58, as shown in FIG. 6B, and the p+ between each FET serves as a channel stop. Source 42 and drain 44 regions are defined within the p+ openings; source 42 is connected to electrode 32, and drain 44 is connected to buffer amplifier 52 or 54. A metal or polycide gate 46 or 60 is patterned to form the enable gate; metal or polycide with low sheet resistance is required in order to reduce propagation delays. Because the source capacitance is large due to the contribution of Cp plus Cb, it is unnecessary to use a self-aligned gate process in order to avoid gate/source feedthrough. Also, the large capacitance Cp plus Cb reduces the rate of voltage discharge of electrode 32 for a given amount of photogenerated leakage at enable FET 56 or 58. Use of four percent copper aluminum alloy for reflecting layer 26 (and thus for flap 28) limits metal fatigue resulting from the repeated mechanical stress of flap deflection.

Figure 9A:
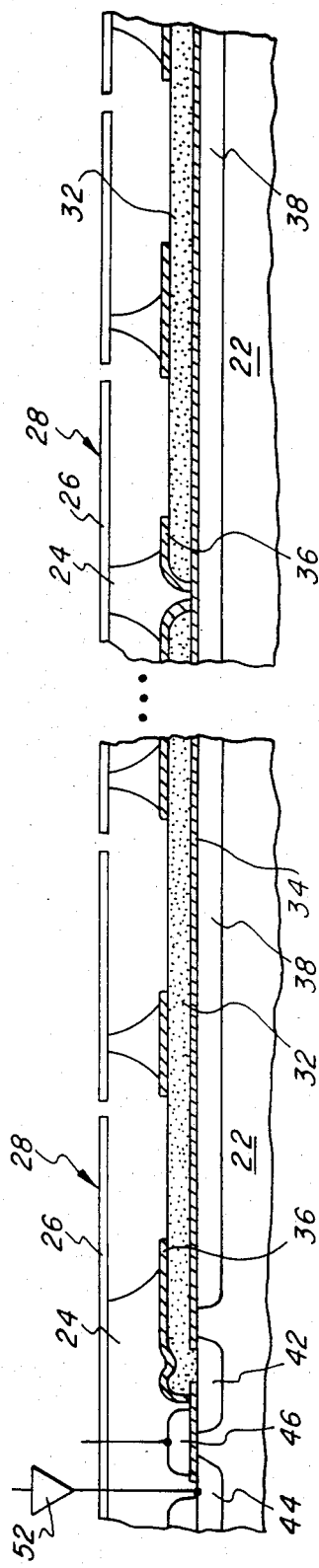
FIGS. 9A-B are cross sectional and plan views of the optically active area and addressing of a second preferred embodiment linear spatial light modulator.
Figure 9B:
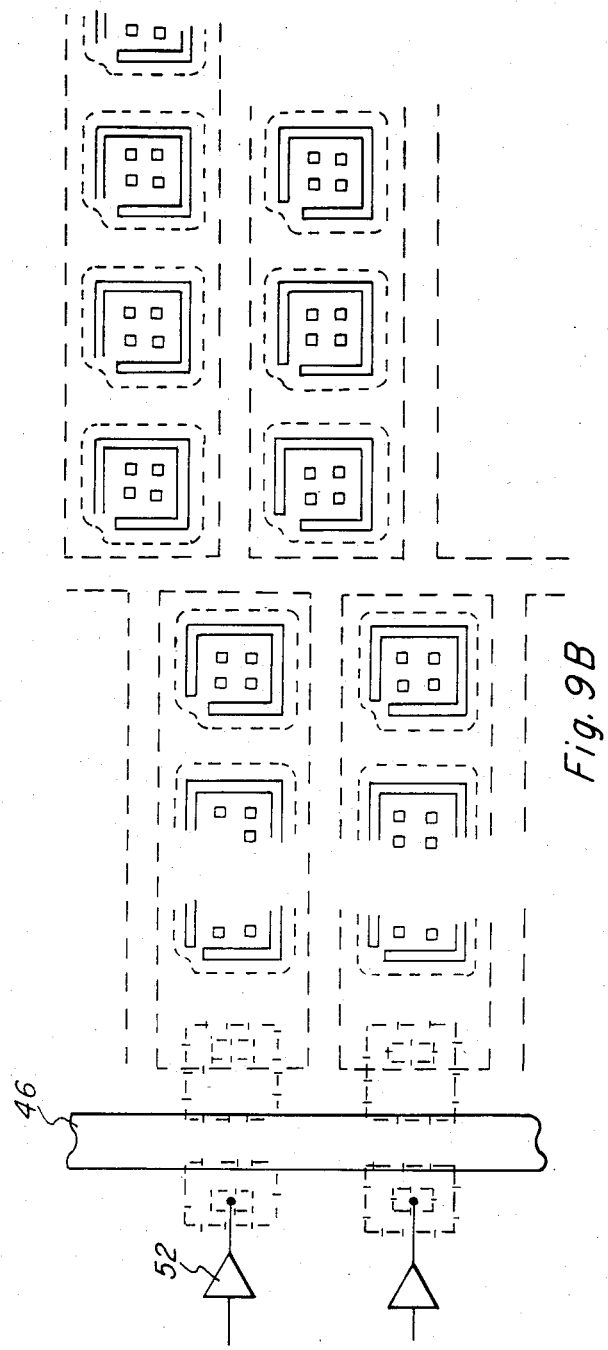

Second preferred embodiment linear SLM is illustrated in FIGS. 9A–B which show cross sectional elevation and plan views of portions of the optically active area, respectively. Second preferred embodiment linear SLM is the same as first preferred embodiment linear SLM outside of the optically active area and differs in the optically active area by stacking additional pixels in order to increase the optical area. Note that all the pixels in a stack are driven by a common electrode 32 (the numbering of the first preferred embodiment has been carried over). Thus, FIGS. 1,2,4,5, and 8 apply to this second preferred embodiment with the obvious modifications, FIGS. 3 and 6 are replaced by FIG. 9, and FIG. 7 will be seen to apply in the following discussion.

Figure 10A:
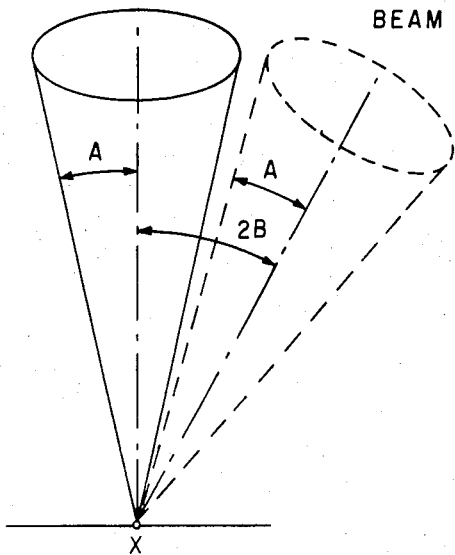
FIGS. 10A-B show the dependence of brightness on angle of deflection.
Figure 10B:
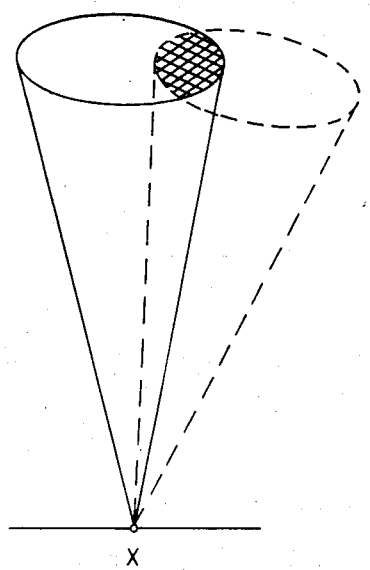

Generally, the irradiance of the output of a first preferred embodiment linear SLM depends on the irradiance of the input multiplied by the optically active area. The optically active area can be increased (as in the second preferred embodiment) so that a larger light source can be used to produce the same irradiance over the larger optically active area, and the output of this larger area can be focussed to same place as the original (i.e., FIG. 7); alternatively, the irradiance of the input can be increased by focussing a larger light source onto the original optically active area. However, the ability to do this without degradation of output contrast is limited by the angle of deflection of the flaps. To understand this degradation the cone angle of incident light (corresponding to the degree by which the source is focussed down onto the optically active area) must be compared to the angle of deflection of the flaps; see FIGS. 10A–B. In FIGS. 10A–B a point X is shown illuminated with a cone of light having a half angle A. If point X lies within the inactive area, then the reflected cone is shown in solid lines and also has a half angle A. And if point X is on a deflected flap, then the reflected cone is shown in dotted lines and also has a half angle A; the separation of the axes of these two cones is twice the angle B of deflection of the flap. Provided that B is greater than A, the two cones do not overlap, as in FIG. 10A. Whereas, if A is greater than B, then the cones overlap as shown in FIG. 10B. Because light rays emanating in this overlap region cannot be distinguished, the energy in the overlap region represents a contrast degradation. To avoid a contrast degradation, the schlieren or dark field projection optics must be designed to pass only that portion of the dotted line cone which lies outside of the solid line cone; but this reduces the irradiance of the output.

The modulated strip of light energy radiating from a stack of subpixels in second preferred embodiment linear SLM has a high aspect ratio which must be converted back to a square image on the rotating drum as in FIG. 7. This can be accomplished through the use of anamorphic projection optics having a smaller magnification in the direction perpendicular to the SLM than in the direction parallel; see FIG. 11 where the output of stacks of ten sub pixels, each sub pixel with a 12.5 micron (0.5 mil) square flap and separated from neighboring sub pixels by the same distance, are magnified 0.33 in the perpendicular and 6.7 in the parallel to form 300 dots per inch on the rotating drum.

Figure 12:
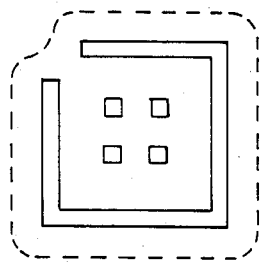
FIG. 12 illustrate alternative beam geometries for the preferred embodiment linear spatial light modulators.
Figure 12:
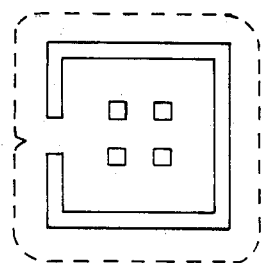
Figure 12:
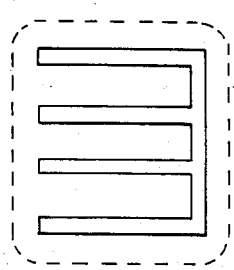
Figure 12:
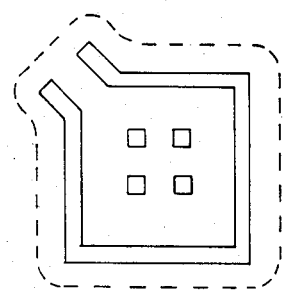
Figure 12:
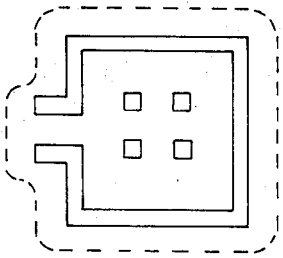
Figure 12:
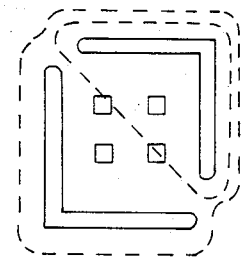

Both the first preferred embodiment and the second prefered embodiment could also have been formed with flap 28 of different shapes but using the same processing. FIG. 12 illustrates various alternatives in plan view. Of course, the number of plasma etch access holes will depend upon the size of the flap or diving board and the depth of the underlying well. Flaps bend primarily at the hinge point, whereas diving boards (FIG. 12C) bend along the entire beam. Torsion hinges (FIG. 12F) twist along the axis through the hinges; the torque is generated by removing a triangular portion of the underlying electrode (indicated by the dashed line) so only the half of the flap on one side of the twist axis is attracted to the electrode. Because flaps are bent at nearly a constant angle, they have a greater diffraction efficiency than comparably sized diving boards. The flap hinge may be at the corner or along a side; a corner flap hinge will bend in a direction that is rotated 45 degrees with respect to the plasma etch access gaps that define the perimeter of the flap. With this geometry, 45 degree schlieren stop or 45 degree dark field discrimination can be used to produce a high contrast projected image of the deflected flap. In this discrimination technique an optical stop is designed which blocks all of the on-axis diffracted light from the flap perimeter openings (plasma etch access gap), but passes the off-axis light from the 45 degree flap deflection. The plasma etch access holes diffract light nearly isotropically, so some of this light passes around a schlieren stop. However, the resultant degradation is negligible because each hole diffracts only a small portion of the total light energy impinging on each pixel and only a small fraction of that energy is passed by the stop. Similarly, torsion hinges may be at opposite corners (as in FIG. 12F) so the twist axis is rotated 45 degrees with respect to the flap perimeter, or the hinges may be at opposite sides and with a twist axis parallel to the flap perimeter.

The deflection sensitivity of flaps may be increased by extending the hinge region, as shown in two of the alternatives illustrated in FIGS. 12D-E. Further, the removal of the portion of the underlying electrode nearest the tip of maximum deflection may also be used to increase the angle of deflection for all geometry flaps and diving boards because this will make the collapse voltage and maximum stable deflection be determined by the portion of the flap or diving board excluding that over the removed electrode portion.

Figure 11:
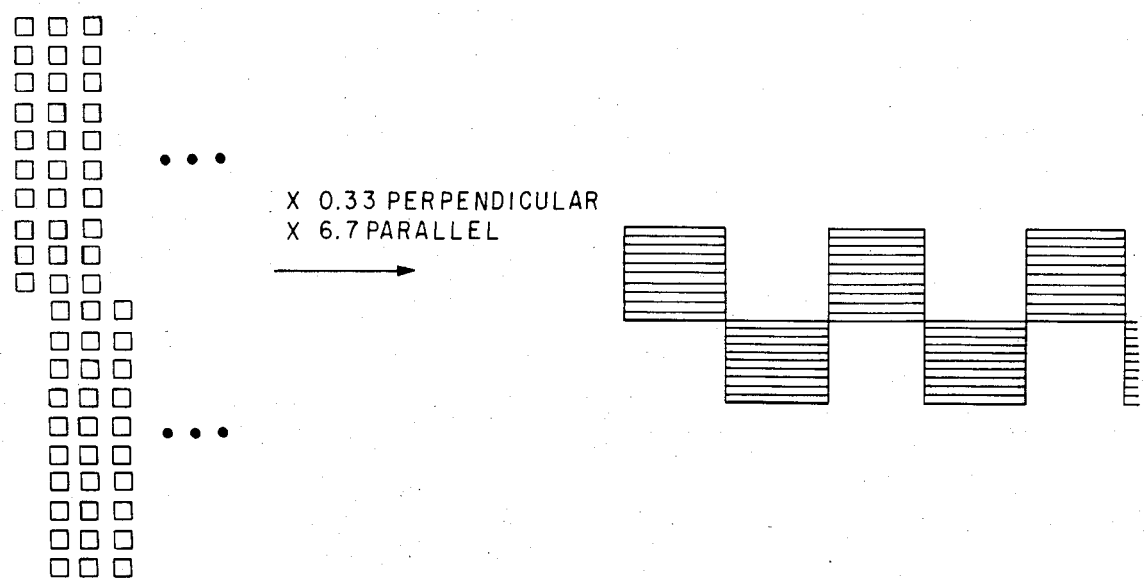
FIG. 11 shows the image on the xerographic drum for the second preferred embodiment linear spatial light modulator.
Figure 13A:
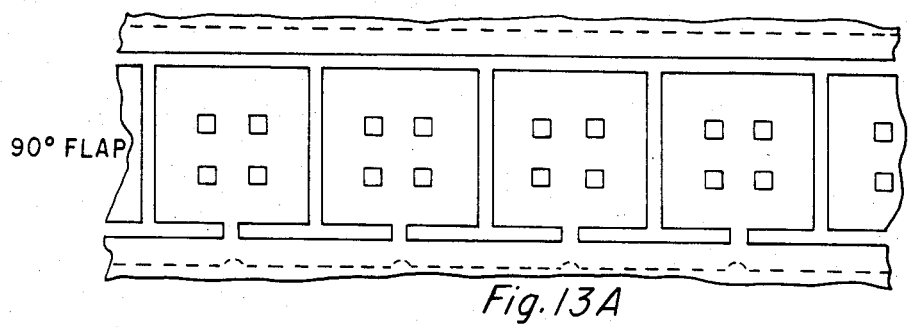
FIGS. 13a-13c illustrate various alternative arrays of beams.
Figure 13B:
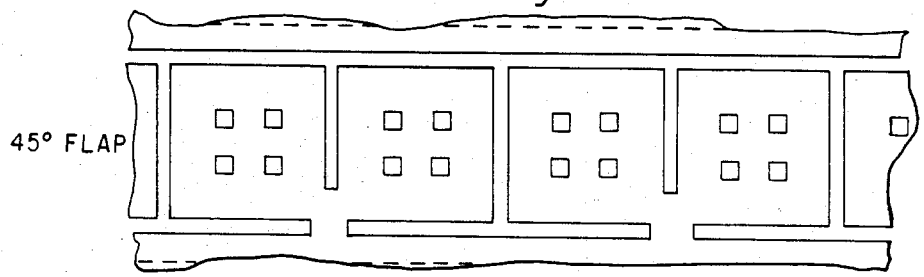
Figure 13C:
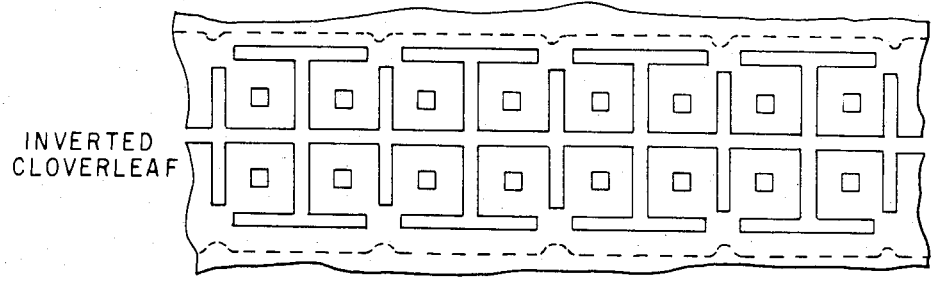

FIG. 13 illustrates possible packings of subpixels which would shrink the vertical dimension of the arrangement of FIGS. 9 and 11. In the pixels of FIG. 13 note that the subpixels share one large well under their flaps so there is somewhat less support by the spacer for the reflecting layer. Further, the orientations of the hinges implies possible use of 45 degree discrimination in the arrangements of FIG. 13B-C but only schlieren and not dark field because reflected light energy from deflected pixels appears in more than one quadrant of the schlieren stop.

Figure 14A:
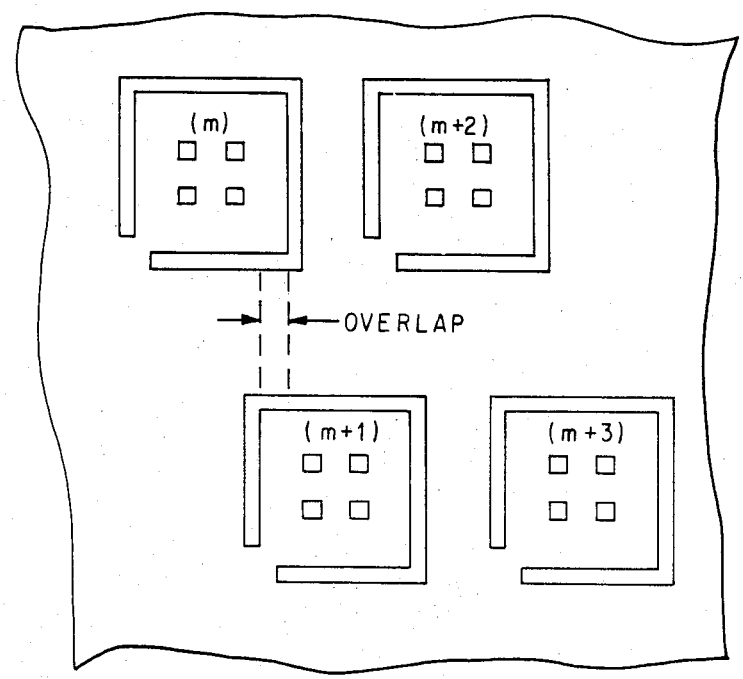
FIG. 14 illustrates the effect of pixel overlap.
Figure 14B:
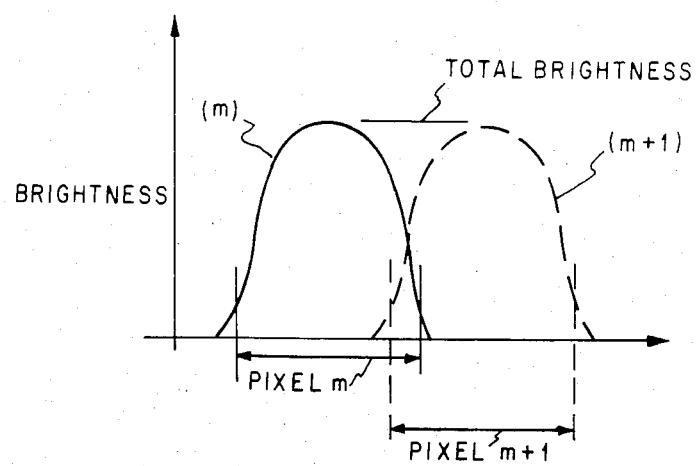

The packings of subpixels of FIG. 13 could also be used as a packing of pixels along the SLM; that is, the offset double row of FIGS. 2A and 3B could be replaced by a single packed row of FIG. 13. The single row arrangement would obviate the need for treating the even and odd numbered dot data differently by delaying one of them; however, the offset arrangement permits a distance between neighboring pixels which provides support for the reflecting layer by the spacer between the pixels and also provides some isolation of the electrodes to lessen electrode influence on neighboring flaps. Also, with the single packed row the use of stacked subpixels is limited because of the lack of supporting spacer under the reflecting layer. Lastly, offset pixels permits overlap of the even and odd pixel images, and this overlap can be adjusted to provide the best uniformity of image brightness on the rotating drum; see FIG. 14 with its upper portion illustrating the physical overlap and its lower portion the resulting image brightness.

Third preferred embodiment linear SLM is illustrated in FIGS. 15A-C and has stacked subpixels forming pixels but also the pixels are contiguous rather than offset. In particular, FIGS. 15A-B are analogs of FIGS. 9A-B and the corresponding items have the same reference numbers; whereas FIG. 15C is a cross sectional view in a direction perpendicular to the line of the pixels. In more detail, the basic beam structure in the third preferred embodiment is a cloverleaf of four beams hinged at one corner to a central post; see FIG. 15C which shows two cloverleaf cross sections with beams 28 joining post 29 extending down to p+ layer 38 on substrate 22. The plan view of FIG. 15B shows the hinging of beams 28 to post 29; beams 28 and post 29 may be a single piece of metal and post 29 provides electrical connection of beams 28 to gounded p+ layer 38. Oxide layer 34 insulates electrodes 32 from grounded layer 38, and thus when an electrode 32 is electrically driven, the beams 28 above such electrode deflect towards it, as previously described with the other embodiments. Also as previously described, enable gate 46 turns on the enable FET with source 42 and drain 44 to drive electrode 32 with the output of buffer amplifier 52. Each pixel includes one electrode 32 plus the beams 28 above such electrode; hence each cloverleaf is shared by two adjacent pixels and the pixels are packed without offset as with the arrays illustrated in FIG. 13. This packing of the pixels implies that the illuminated area of the third preferred embodiment is entirely deflectable beams 28; this permits use of reverse dark field optics in the printer because there is no background illumination from inactive area which would act to degrade contrast.

Fabrication of third preferred embodiment linear SLMs is similar to that of the first preferred embodiment previously described; the major change is that prior to depositing the beam metal, the spacer is patterned to form holes down to layer 38. During the deposition of the beam metal, posts 29 will be formed in these holes. Another change from the previously described fabrication process is the plasma etch to form the wells in the spacer; since the spacer is not used for support in the third preferred embodiment, the spacer can be completely removed. This complete removal of the spacer implies that the plasma etch need not be monitored and that plasma etch access holes are unnecessary.

Immediate variations of the third preferred embodiment include using only a single line of cloverleaves (i.e., not stacking sub pixels), using all four beams on a post in the same pixel, and only forming one or two beams on a post (i.e., an unsymmetrical arrangement on the post). Use of all four beams in the same pixel has a size drawback: for the 300 dots per inch printer, the SLM has 2,400 pixels in a line; and if each pixel were 25 microns square (i.e., four beams with each beam about 12 microns square), then the SLM chip would need an active area 2.4 inches long. Making the beams smaller runs into the problem that the post will typically have a minimum diameter of one or two microns and thus for a beam much less than 12 microns square, the post occupies too much of the area.

I claim:
1. A linear spatial light modulator, comprising:
 (a) a plurality of pixels formed in a layered structure, said pixels arranged substantially in a line;
 (b) said layered structure including a substrate, a rigid insulating spacer layer on said substrate, a conducting reflecting layer on said spacer layer, and electrical addressing circuitry;
 (c) each of said pixels including:
  (i) an electrostatically deflectable element formed in said reflecting layer, and

(ii) a well formed in said spacer layer and located beneath said deflectable element plus adjacent portions of said reflecting layer, said well characterized by formation by plasma etching of said spacer between said substrate and said reflecting layer; and (d) said addressing circuitry including a plurality of electrodes between said substrate and said spacer layer, said electrodes insulated from said substrate and from each other and arranged substantially perpendicular to said line, each of said electrodes extending from the bottom of one of said wells to one of a plurality of pass transistors located away from said line and beneath said spacer layer.

2. The linear spatial light modulator of claim 1, wherein:

(a) said circuitry further includes a shift register on said substrate with outputs to said pass transistors.

3. A linear spatial light modulator, comprising:

(a) a plurality of pixels arranged substantially in a line on a substrate;

(b) each of said pixels including an electrostatically deflectable element supported away from said substrate by a conducting post narrower than said element's width;

(c) a plurality of electrodes on said substrate and arranged substantially perpendicular to said line, each of said electrodes extending from beneath one of said deflectable elements to a pass transistor located away from said line; and a plurality of conductors on said substrate insulated from said electrodes and electrically connecting said posts.

4. The linear spatial light modulator of claim 3, further comprising:

(a) a shift register on said substrate with outputs to said pass transistors.

5. A nonimpact printer, comprising:

(a) a light source;

(b) a first optical system to focus light from said light source onto the linear optically active area of a linear spatial light modulator;

(c) said linear spatial light modulator including a plurality of pixels arranged substantially in a line in a layered structure to form said optically active area, said layered structure including a substrate, a rigid insulating spacer layer on said substrate, a conducting reflecting layer on said spacer layer, and each of said pixels including an electrostatically deflectable element formed in said reflecting layer and a well formed in said spacer layer and located beneath said deflectable element and characterized by plasma etching of said spacer between said substrate and said reflecting layer;

(d) addressing circuitry on said substrate for converting electrical signals into deflectable element deflections; and (e) a second optical system for foucssing the light reflected from the deflected ones of said deflectable elements onto a xerographic drum, said second optical system characterized by the image of said linear optically active area being a linear region parallel to the axis of said drum.

6. The nonimpact printer of claim 5, wherein:

(a) said deflectable elements all deflect in the same direction; and (b) said second optical system includes a dark field projection system.

7. The nonimpact printer of claim 5, wherein:

(a) said deflectable elements form two offset rows; and (b) said addressing circuitry includes a plurality of electrodes arranged substantially perpendicular to said line and formed into two groups, an electrode from a first of said groups extending from under one of said deflectable elements in a first of said rows in a first direction, and an electrode from the second of said groups extending from under one of said defelctable elements in the second of said rows in a direction opposite said first direction.

8. The nonimpact printer of claim 5, wherein:

(a) each of said pixels including at least two deflectable elements arranged in a direction perpendicular to said line.

* * * * *